United States Patent
Leong et al.

(10) Patent No.: US 8,143,825 B2
(45) Date of Patent: Mar. 27, 2012

(54) DETERMINING STUCK CONDITIONS FOR ELECTRIC MOTORS USING INDUCTIVE SENSING

(75) Inventors: Foo Leng Leong, Singapore (SG); Edy Susanto, Singapore (SG); Cheng Yong Teoh, Singapore (SG)

(73) Assignee: Marvell World Trade Ltd., St. Michael (BB)

( * ) Notice: Subject to any disclaimer, the term of this patent is extended or adjusted under 35 U.S.C. 154(b) by 434 days.

(21) Appl. No.: 12/417,680

(22) Filed: Apr. 3, 2009

(65) Prior Publication Data

US 2010/0102768 A1    Apr. 29, 2010

Related U.S. Application Data

(60) Provisional application No. 61/108,260, filed on Oct. 24, 2008.

(51) Int. Cl.
*H02P 6/00* (2006.01)

(52) U.S. Cl. ................... 318/400.01; 318/400.32

(58) Field of Classification Search ............. 318/400.01, 318/400.32, 400.33
See application file for complete search history.

(56) References Cited

U.S. PATENT DOCUMENTS

| | | | | |
|---|---|---|---|---|
| 5,467,025 A * | 11/1995 | Ray | ................................. | 324/545 |
| 6,456,031 B1 * | 9/2002 | Gallegos-Lopez et al. | ... | 318/701 |
| 6,586,903 B2 * | 7/2003 | Moriarty | ....................... | 318/701 |
| 6,664,749 B2 * | 12/2003 | Heydt et al. | ............. | 318/400.34 |
| 7,026,774 B2 * | 4/2006 | Inaba et al. | ............. | 318/400.33 |
| 7,057,362 B2 * | 6/2006 | Norman | ..................... | 318/400.2 |

* cited by examiner

*Primary Examiner* — Rina Duda

(57) ABSTRACT

A control system includes a position control module, a power control module, and a diagnostic module. The position control module applies a driving current for positioning a rotor of a motor at one of first and second positions. The power control module applies a first voltage to one of first and second phases of the motor to generate a first current after the position control module applies the driving current to position the rotor at the first position. The power control module applies a second voltage to one of the first and second phases to generate a second current after the position control module applies the driving current to position the rotor at the second position. The diagnostic module determines when the rotor is restricted from rotating based on the first and second currents.

16 Claims, 8 Drawing Sheets

Rotor at Position A

Rotor at Position B

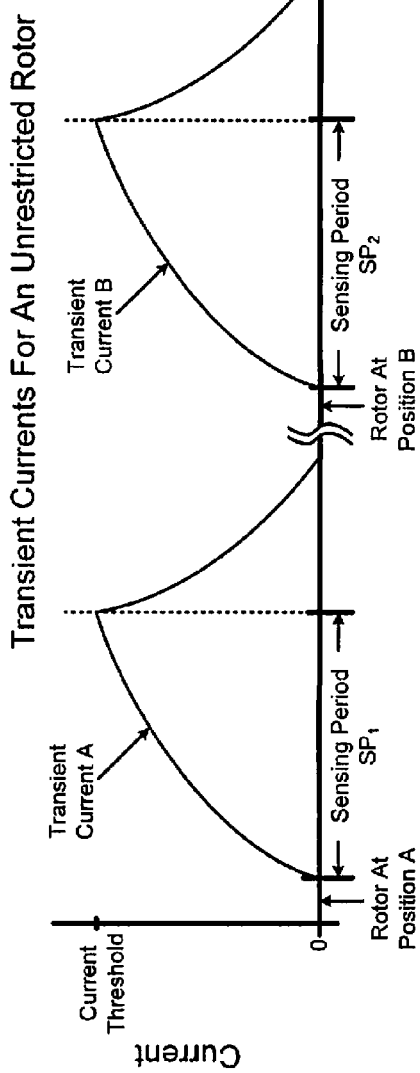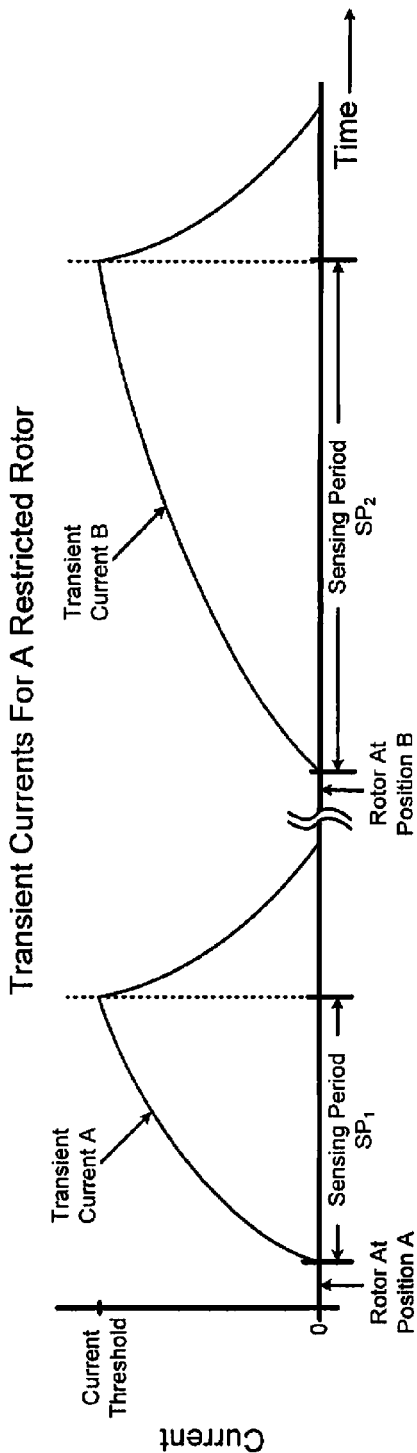

DETERMINING STUCK CONDITIONS FOR ELECTRIC MOTORS USING INDUCTIVE SENSING

CROSS-REFERENCE TO RELATED APPLICATIONS

This application claims the benefit of U.S. Provisional Application No. 61/108,260, filed on Oct. 24, 2008. The disclosure of the above application is incorporated herein by reference in its entirety.

FIELD

The present disclosure relates to electric motor control, and particularly to determining whether a rotor is restricted from rotating.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Cooling fan assemblies may provide airflow to dissipate heat generated by electronic components. Cooling fan assemblies may include a motor that drives fan blades via a rotor. The rotor may be restricted from rotating (hereinafter "restricted") when an object is placed in the path of the fan blades. Airflow is reduced when the rotor is restricted. Accordingly, the electronic components may be thermally damaged due to a decrease in heat dissipation when the rotor is restricted.

Referring now to FIG. 1, a cooling fan system 100 includes a motor 102 and a motor control module 104. The motor 102 may include a two-phase brushless direct current (DC) motor. The motor 102 may include four stator poles: pole A1 106, pole A2 108, pole B1 110, and pole B2 112. Each of the stator poles may be wound with stator coils 114. Pole A1 106 and pole A2 108 may collectively be called "pole pair A." Pole B1 110 and pole B2 112 may collectively be called "pole pair B." The motor control module 104 may apply a voltage and/or current to the stator coils 114 of pole pair A to generate a magnetic field between pole A1 106 and pole A2 108. Applying the voltage and/or current to the stator coils 114 of pole pair A may be called "driving phase A." The motor control module 104 may provide the voltage and/or current to the stator coils 114 of pole pair B to generate a magnetic field between pole B1 110 and pole B2 112. Applying the voltage and/or current to the stator coils 114 of pole pair B may be called "driving phase B."

The motor 102 includes a rotor 116. The rotor 116 may include at least one permanent magnet. The motor control module 104 may drive phase A and/or phase B to actuate the rotor 116 about an axle 118. The axle 118 may mechanically couple the rotor 116 to a device. For example, the axle 118 may mechanically couple the rotor 116 to a fan 120 used to cool electronic components. While the rotor 116 in FIG. 1 rotates between the stator poles 106, 108, 110, 112, the motor 102 may include a rotor that surrounds the stator poles 106, 108, 110, 112.

The motor control module 104 may alternate between driving phase A and driving phase B to actuate the rotor 116. The motor 102 may include at least one Hall-effect sensor 122 that indicates rotation of the rotor 116. For example, the Hall-effect sensor 122 may generate a pulse when a magnetic pole of the rotor 116 passes the Hall-effect sensor 122. The motor control module 104 may determine whether the rotor 116 is rotating based on the pulses from the Hall-effect sensor 122. Accordingly, the motor control module 104 may determine that the rotor 116 is restricted based on the pulses. For example, the motor control module 104 may determine that the rotor 116 is restricted when the motor control module 104 receives no pulses from the Hall-effect sensor 122. When the motor 102 drives the fan 120, the rotor 116 may be restricted when an object is placed in the path of the fan 120.

SUMMARY

A control system comprises a position control module, a power control module, and a diagnostic module. The position control module applies a driving current for positioning a rotor of a motor at one of first and second positions. The power control module applies a first voltage to one of first and second phases of the motor to generate a first current after the position control module applies the driving current for positioning the rotor at the first position. The power control module applies a second voltage to one of the first and second phases to generate a second current after the position control module applies the driving current for positioning the rotor at the second position. The diagnostic module determines whether the rotor is restricted from rotating based on the first and second currents.

In other features, the power control module applies the first voltage to the first phase to generate the first current and applies the second voltage to the first phase to generate the second current.

In other features, the power control module applies the first voltage to the first phase to generate the first current and applies the second voltage to the second phase to generate the second current.

In other features, the diagnostic module determines a first period that begins when the first voltage is applied and that ends when the first current is greater than or equal to a threshold current. The diagnostic module determines a second period that begins when the second voltage is applied and that ends when the second current is greater than or equal to the threshold current. The diagnostic module determines that the rotor is restricted from rotating based on the first and second periods.

In other features, the diagnostic module determines that the rotor is restricted from rotating when a difference between the first and second periods is greater than or equal to a predetermined threshold.

In other features, the diagnostic module determines that the rotor is restricted from rotating when a difference between the first and second periods is less than or equal to a predetermined threshold.

In still other features, a method comprises applying a driving current for positioning a rotor of a motor at one of first and second positions. The method further comprises applying a first voltage to one of first and second phases of the motor to generate a first current after applying the driving current for positioning the rotor at the first position. The method further comprises applying a second voltage to one of the first and second phases to generate a second current after applying the driving current for positioning the rotor at the second position. The method further comprises determining whether the rotor is restricted from rotating based on the first and second currents.

In other features, the method comprises applying the first voltage to the first phase to generate the first current and applying the second voltage to the first phase to generate the second current.

In other features, the method comprises applying the first voltage to the first phase to generate the first current and applying the second voltage to the second phase to generate the second current.

In other features, the method comprises determining a first period that begins when the first voltage is applied and that ends when the first current is greater than or equal to a threshold current. The method further comprises determining a second period that begins when the second voltage is applied and that ends when the second current is greater than or equal to the threshold current. The method further comprises determining that the rotor is restricted from rotating based on the first and second periods.

In other features, the method comprises determining that the rotor is restricted from rotating when a difference between the first and second periods is greater than or equal to a predetermined threshold.

In other features, the method comprises determining that the rotor is restricted from rotating when a difference between the first and second periods is less than or equal to a predetermined threshold.

In still other features, the systems and methods described above are implemented by a computer program executed by one or more processors. The computer program can reside on a computer readable medium such as but not limited to memory, nonvolatile data storage, and/or other suitable tangible storage mediums.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 5A illustrates a first inductive sensing system that determines when the rotor is unrestricted from rotating according to the present disclosure;

FIG. 5B illustrates the first inductive sensing system that determines when the rotor is restricted from rotating according to the present disclosure;

DESCRIPTION

Figure 1:
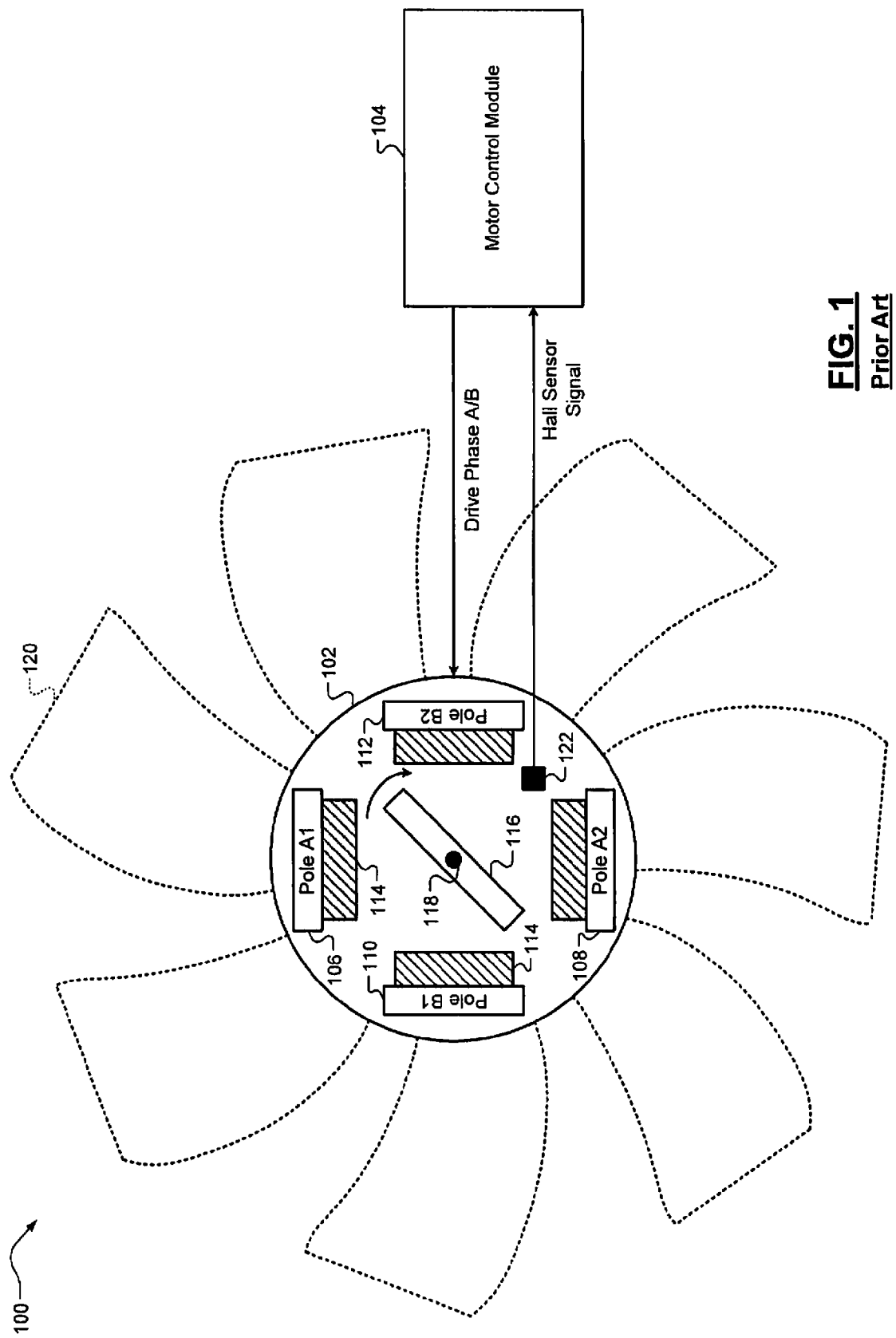
FIG. 1 is a cooling fan system.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Motors may include Hall-effect sensors to detect when the rotor is restricted. For example, motors used in cooling fan assemblies typically include at least one Hall-effect sensor to detect whether an object is obstructing the path of the fan blades. Hall-effect sensors, however, increase the cost of the motor. Additionally, Hall-effect sensors may fail, thereby reducing the reliability of the motor.

Accordingly, an inductive sensing system of the present disclosure determines whether the rotor is restricted without using the Hall-effect sensor. Elimination of the Hall-effect sensor may reduce a number of components included in the electric motor, and therefore may reduce the cost of the motor and increase the reliability of the motor.

The inductive sensing system applies a testing voltage to a phase of the motor when the rotor is at a predetermined position. The system measures a transient current through the phase of the motor when the testing voltage is applied. The system measures a plurality of transient currents at one or more predetermined positions and determines whether the rotor is restricted based on the plurality of transient currents. The system may be implemented prior to starting the motor or at any time the motor is stopped while spinning.

Figure 2:
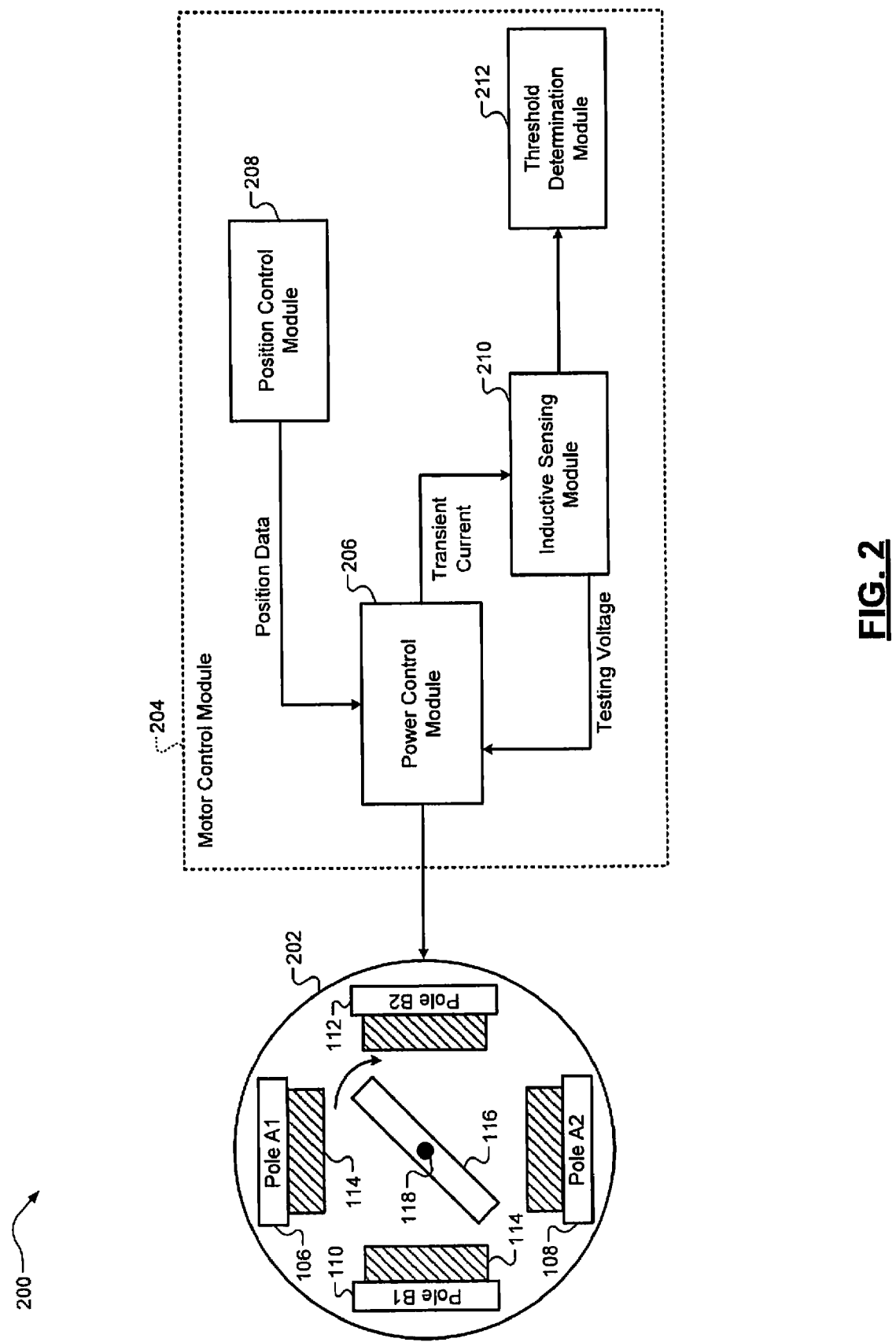
FIG. 2 is a motor control system according to the present disclosure.

Referring now to FIG. 2, an exemplary motor system 200 according to the present disclosure includes a motor 202 and a motor control module 204. For example only, the motor 202 may include a two-phase brushless DC motor. While the inductive sensing system is described using the two-phase brushless DC motor, the inductive sensing system may also be implemented in other motor systems (e.g., three-phase motor systems).

The motor control module 204 includes a power control module 206, a position control module 208, an inductive sensing module 210, and a threshold determination module 212. The power control module 206 may apply a voltage and/or current to the stator coils 114. Accordingly, the power control module 206 may drive phase A and/or phase B. The power control module 206 may alternate between driving phase A and driving phase B to rotate the rotor 116.

The position control module 208 may control a position of the rotor 116 via the power control module 206. The position of the rotor 116 indicates an orientation of the rotor 116 relative to poles A1 106, A2 108, B1 110, and B2 112. The position control module 208 outputs position data to the power control module 206 to control the position of the rotor 116. The power control module 206 drives phase A and/or phase B to adjust the position of the rotor 116 based on the position data received from the position control module 208.

Figure 3A:
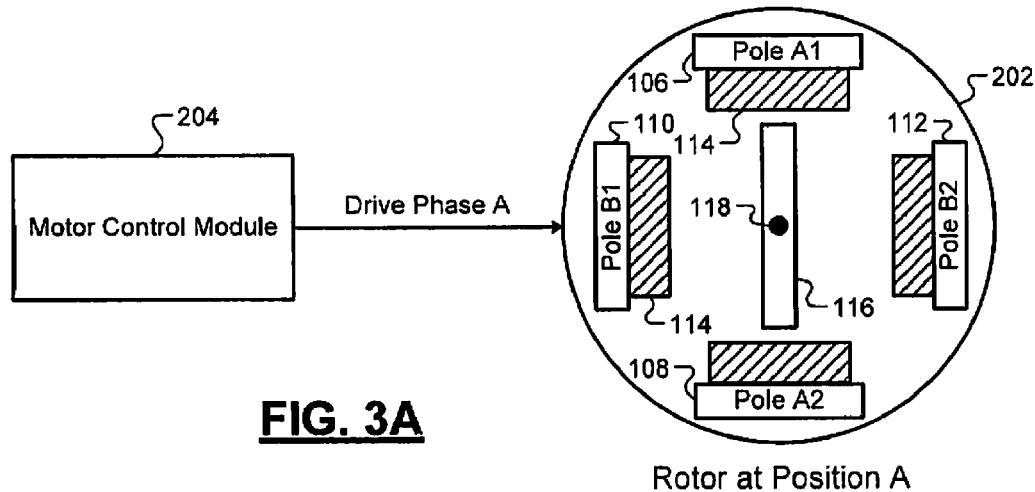
FIG. 3A is the motor control system including a rotor at position A according to the present disclosure.
Figure 3B:
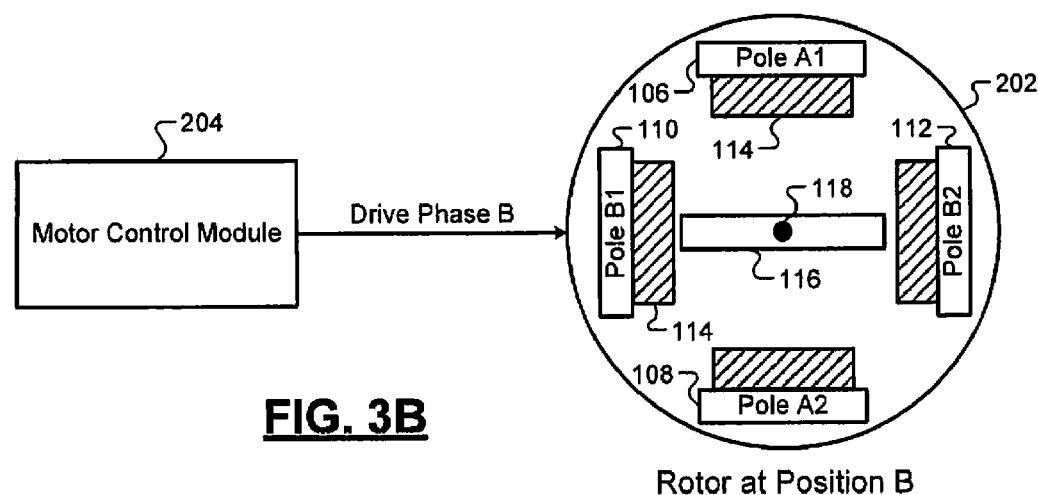
FIG. 3B is the motor control system including the rotor at position B according to the present disclosure.

Referring now to FIGS. 3A-3B, the power control module 206 may drive phase A and/or phase B to adjust the position of the rotor 116 based on the position data received from the position control module 208. For example only, the position control module 208 may store first position data and second position data. The position control module 208 may output the first position data to the power control module 206 to position the rotor 116 at a first position. For example, the first position may include alignment of the rotor 116 along pole pair A. Accordingly, the power control module 206 may drive phase A to align the rotor 116 along pole pair A based on the first position data. In FIG. 3A, the power control module 206 drives phase A to adjust the position of the rotor 116 along pole pair A (hereinafter "position A").

The position control module 208 may output the second position data to the power control module 206 to position the rotor 116 at a second position. For example, the second position may include alignment of the rotor 116 along pole pair B. Accordingly, the power control module 206 may drive phase B to align the rotor 116 along pole pair B based on the second position data. In FIG. 3B, the power control module 206 drives phase B to position the rotor along pole pair B (hereinafter "position B").

Referring back to FIG. 2, the inductive sensing module 210 may instruct the power control module 206 to apply a testing voltage to the stator coils 114 of pole pair A and/or pole pair B. The power control module 206 may measure a transient current through the stator coils 114 when the power control module 206 applies the testing voltage. The transient current may include a time varying current that arises in the stator coils 114 in response to the application of the testing voltage.

The power control module 206 may measure the transient current through the stator coils 114 of pole pair A when the power control module 206 applies the testing voltage to the stator coils 114 of pole pair A. Current arising through the stator coils 114 of pole pair A in response to application of the testing voltage may be called "transient current A." The power control module 206 may measure the transient current through the stator coils 114 of pole pair B when the power control module 206 applies the testing voltage to the stator coils 114 of pole pair B. Current arising through the stator coils 114 of pole pair B in response to application of the testing voltage may be called "transient current B."

Figure 4:
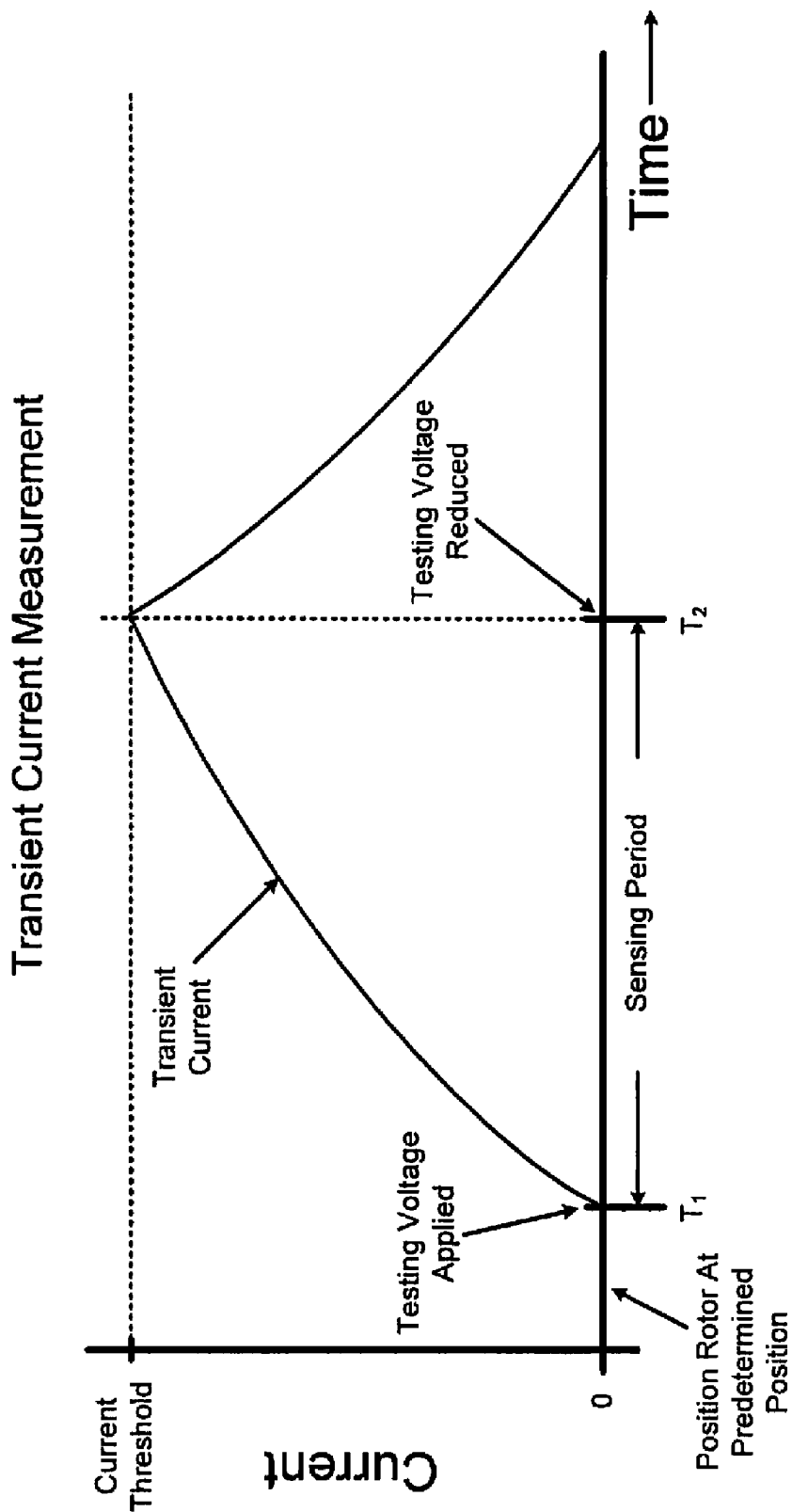
FIG. 4 illustrates a transient current measurement according to the present disclosure.

Referring now to FIG. 4, the inductive sensing system applies the testing voltage and measures the transient current when the rotor 116 is at a predetermined position. The inductive sensing system determines a sensing period based on the transient current. The inductive sensing system may determine the rotor 116 is restricted based on a plurality of sensing periods that correspond to a plurality of predetermined positions.

The position control module 208 outputs position data to the power control module 206 to position the rotor 116 at the predetermined position. The power control module 206 may drive phase A and/or phase B to position the rotor 116 at the predetermined position. For example, the power control module 206 may drive phase A when the predetermined position is position A. The power control module 206 may drive phase B when the predetermined position is position B.

The inductive sensing module 210 instructs the power control module 206 to apply the testing voltage. The power control module 206 stores a value indicative of a time ($T_1$) when the power control module 206 applies the testing voltage. The power control module 206 may apply the testing voltage to the stator coils 114 of pole pair A and/or pole pair B. For example, the power control module 206 may apply the testing voltage to the stator coils 114 of pole pair A when the rotor 116 is at position A. Alternatively, the power control module 206 may apply the testing voltage to the stator coils 114 of pole pair B when the rotor 116 is at position A.

The power control module 206 measures the transient current generated when the power control module 206 applies the testing voltage to the stator coils 114. Measuring the transient current through the stator coils 114 of pole pair A while applying the testing voltage to the stator coils 114 of pole pair A may be called "testing pole pair A." Measuring the transient current through the stator coils 114 of pole pair B while applying the testing voltage to the stator coils 114 of pole pair B may be called "testing pole pair B." The power control module 206 may test pole pair A and/or pole pair B.

The inductive sensing module 210 outputs a threshold current to the power control module 206 that indicates a maximum current the power control module 206 may output when applying the testing voltage. The inductive sensing module 210 may determine the threshold current based on an amount of current sufficient to actuate the rotor 116. For example, the inductive sensing module 210 may set the threshold current at less than an amount of current sufficient to actuate the rotor 116. The inductive sensing module 210 may set the threshold current at less than the amount of current sufficient to actuate the rotor 116 to reduce disturbances in the transient current due to rotation of the rotor 116.

The power control module 206 applies the testing voltage and measures the transient current until the transient current is greater than or equal to the threshold current. The power control module 206 determines a time ($T_2$) when the transient current is greater than or equal to the threshold current. The power control module 206 may reduce the testing voltage when the transient current is greater than or equal to the threshold current. For example, the power control module 206 may set the testing voltage to zero when the transient current is greater than or equal to the threshold current. The transient current may decrease when the testing voltage is reduced. The power control module 206 outputs times $T_1$ and $T_2$ to the inductive sensing module 210.

The inductive sensing module 210 may determine the sensing period based on $T_1$ and $T_2$. For example, the inductive sensing module 210 may determine the sensing period by subtracting $T_1$ from $T_2$. The inductive sensing module 210 outputs the sensing period to the threshold determination module 212.

Duration of the sensing period may depend on the position of the rotor 116 and the pole pair tested. The duration of the sensing period may be described as short or long. For example only, the sensing period may be short when the power control module 206 tests pole pair A while the rotor 116 is at position A, or tests pole pair B while the rotor 116 is at position B. Alternatively, the sensing period may be long when the power control module 206 tests pole pair B while the rotor 116 is at position A, or tests pole pair A while the rotor 116 is at position B. Furthermore, the sensing period for testing pole pair A while at position A may be similar in duration to the sensing period for testing pole pair B while at position B.

The inductive sensing system may determine the rotor 116 is restricted based on the plurality of sensing periods and a threshold period. The system may determine when the rotor 116 of the two-phase brushless DC motor is restricted based on a difference between two sensing periods and the threshold period. For example only, the system may determine that the rotor 116 is restricted when the difference between the two sensing periods is greater than or equal to the threshold period.

Referring now to FIGS. 5A and 5B, a first inductive sensing system determines when the rotor 116 of the two-phase brushless DC motor is restricted based on a difference between two sensing periods. The power control module 206 positions the rotor 116 at position A. The power control module 206 tests pole pair A to determine the sensing period ($SP_1$) when the rotor 116 is at position A. The power control module 206 positions the rotor 116 at position B. The power control module 206 tests pole pair B to determine the sensing period ($SP_2$) when the rotor 116 is at position B. The threshold determination module 212 determines a difference between $SP_1$ and $SP_2$. The threshold determination module 212 compares the difference between $SP_1$ and $SP_2$ to a first threshold period. The threshold determination module 212 determines that the rotor 116 is restricted when the difference between $SP_1$ and $SP_2$ is greater than or equal to the first threshold period.

In other words, the sensing period for testing pole pair A while at position A may be similar in duration to the sensing period for testing pole pair B while at position B. Therefore, the sensing periods $SP_1$ and $SP_2$ should be similar in duration when the rotor 116 is not restricted (i.e., may rotate freely from position A to position B). In FIG. 5A, the first inductive sensing system determines that the rotor 116 is not restricted since the sensing periods $SP_1$ and $SP_2$ are similar in duration. In FIG. 5B, the first inductive sensing system determines that the rotor 116 is restricted since the sensing periods $SP_1$ and $SP_2$ are not similar in duration (i.e., the difference between $SP_1$ and $SP_2$ is greater than or equal to the first threshold period).

Figure 6A:
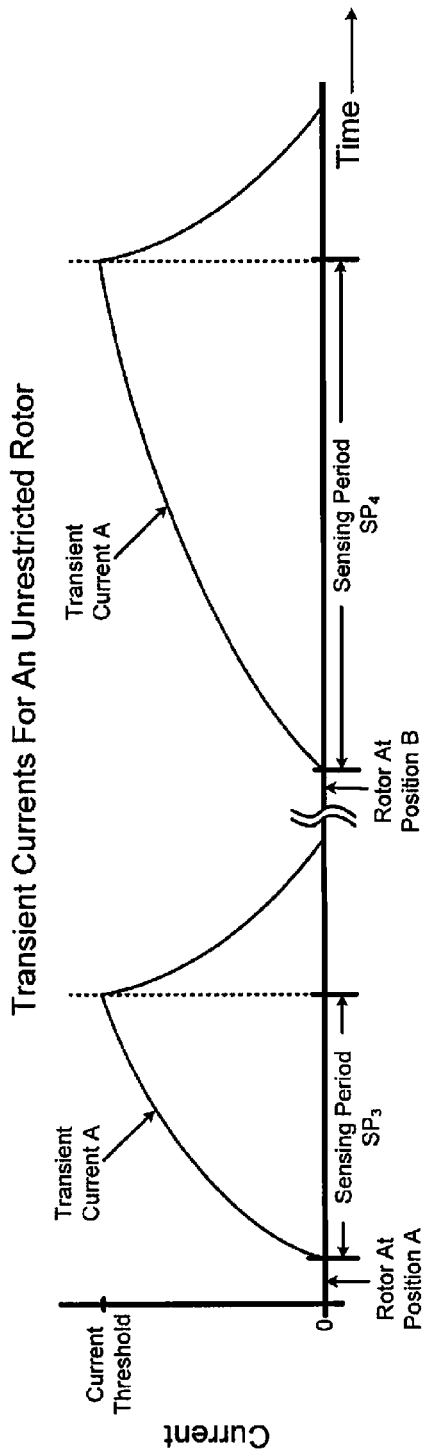
FIG. 6A illustrates a second inductive sensing system that determines when the rotor is unrestricted from rotating according to the present disclosure.
Figure 6B:
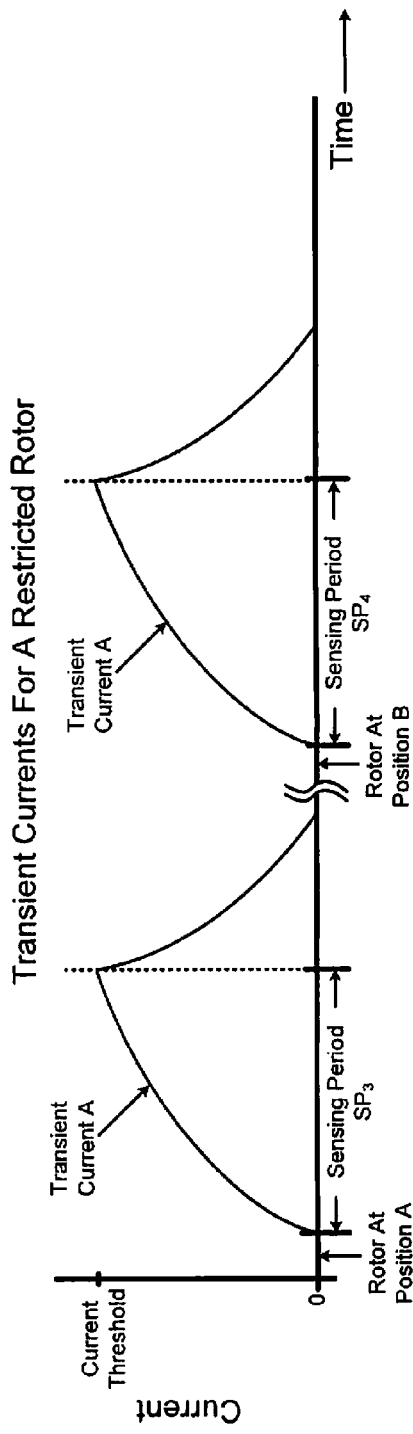
FIG. 6B illustrates the second inductive sensing system that determines when the rotor is restricted from rotating according to the present disclosure.

Referring now to FIGS. 6A and 6B, a second inductive sensing system determines when the rotor 116 of the two-phase brushless DC motor is restricted based on the difference between two sensing periods. The power control module 206 positions the rotor 116 at position A. The power control module 206 tests pole pair A to determine the sensing period ($SP_3$) when the rotor 116 is at position A. The power control module 206 positions the rotor 116 at position B. The power control module 206 tests pole pair A to determine the sensing period ($SP_4$) when the rotor 116 is at position B. The threshold determination module 212 determines a difference between $SP_3$ and $SP_4$. The threshold determination module 212 compares the difference between $SP_3$ and $SP_4$ to a second threshold period. The threshold determination module determines that the rotor 116 is restricted when the difference between $SP_3$ and $SP_4$ is less than or equal to the second threshold period.

In other words, the sensing period for testing pole pair A while at position A may be shorter in duration than the sensing period for testing pole pair A while at position B. Therefore, the sensing periods $SP_3$ and $SP_4$ should be different in duration when the rotor 116 is not restricted. In FIG. 6A, the second inductive sensing system determines that the rotor 116 is unrestricted since the sensing periods $SP_3$ and $SP_4$ are not similar in duration. In FIG. 6B, the second inductive sensing system determines that the rotor 116 is restricted since the sensing periods $SP_3$ and $SP_4$ are similar (i.e., the difference between $SP_3$ and $SP_4$ is less than or equal to the second threshold period).

Figure 7:
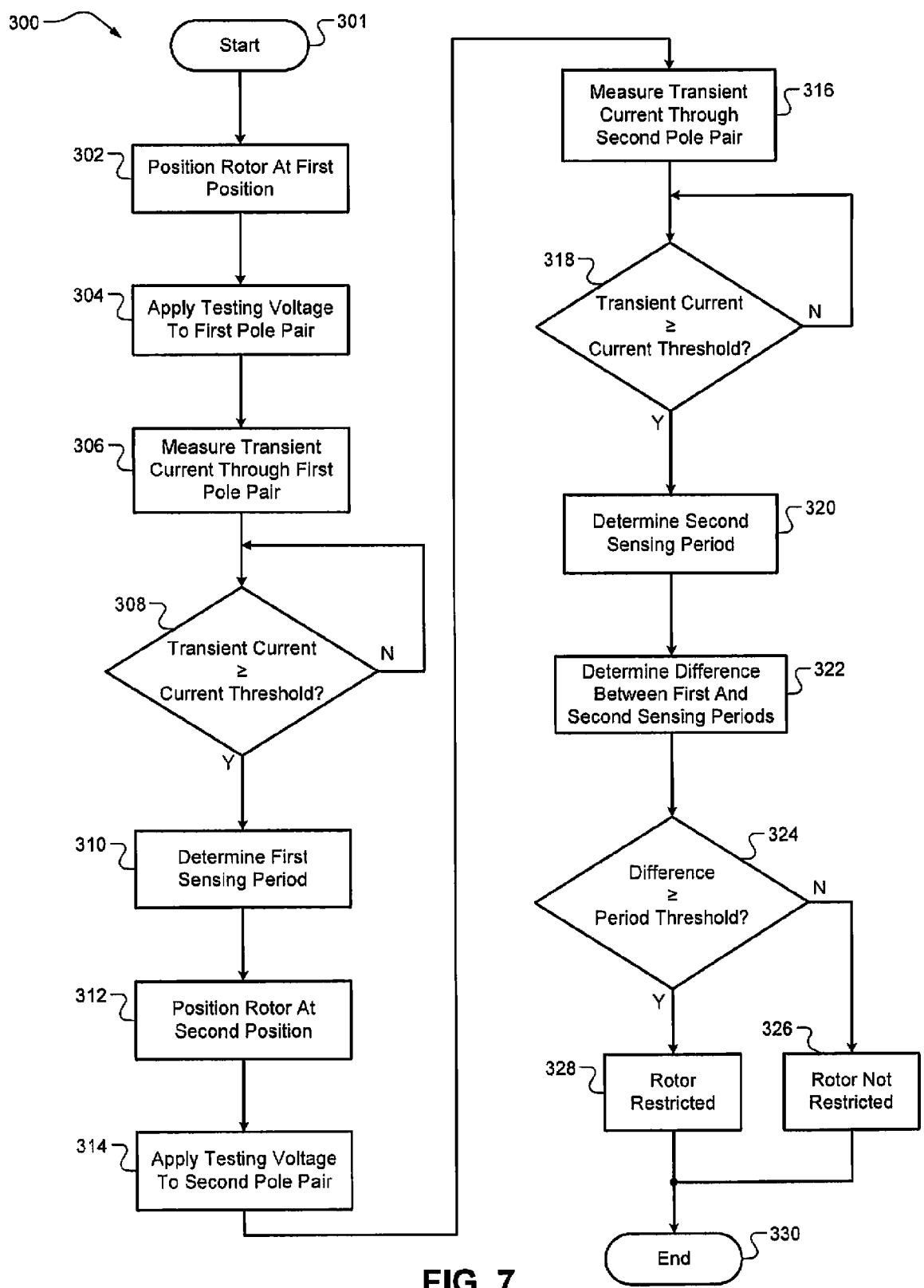
FIG. 7 is a flowchart of a first method for detecting when the rotor is restricted from rotating according to the present disclosure.

Referring now to FIG. 7, a first method 300 for detecting when a rotor is restricted from rotating starts in step 301. In step 302, the power control module 206 positions the rotor 116 at the first position. In step 304, the power control module 206 applies the testing voltage to the stator coils 114 of a first pole pair. In step 306, the power control module 206 measures the transient current through the stator coils 114 of the first pole pair. In step 308, the power control module 206 determines whether the transient current is greater than or equal to the threshold current. If the result of step 308 is false, the method 300 repeats step 308. If the result of step 308 is true, the method 300 continues with step 310. In step 310, the inductive sensing module 210 determines the first sensing period.

In step 312, the power control module 206 positions the rotor 116 at the second position. In step 314, the power control module 206 applies the testing voltage to the stator coils 114 of a second pole pair. In step 316, the power control module 206 measures transient current through the stator coils 114 of the second pole pair. In step 318, the power control module 206 determines whether the transient current is greater than or equal to the threshold current. If the result of step 318 is false, the method 300 repeats step 318. If the result of step 318 is true, the method 300 continues with step 320. In step 320, the inductive sensing module 210 determines the second sensing period.

In step 322, the threshold determination module 212 determines the difference between the first sensing period and the second sensing period. In step 324, the threshold determination module 212 determines whether the difference is greater than or equal to a first threshold period. If the result of step 324 is false, the method 300 continues with step 326. If the result of step 324 is true, the method 300 continues with step 328. In step 326, the threshold determination module 212 determines that the rotor 116 is not restricted. In step 328, the threshold determination module 212 determines that the rotor 116 is restricted. The method 300 ends in step 330.

Figure 8:
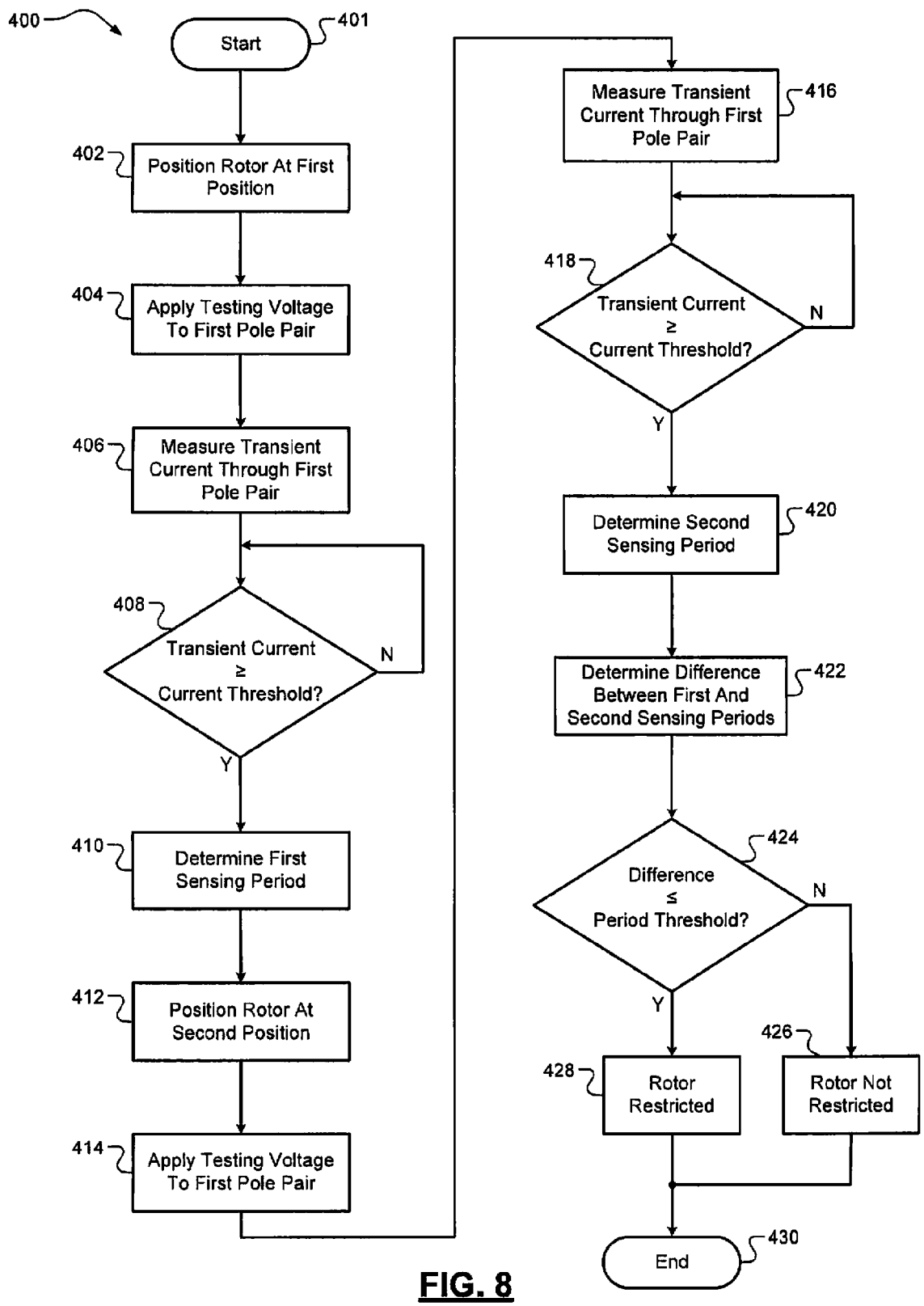
FIG. 8 is a flowchart of a second method for detecting when the rotor is restricted from rotating according to the present disclosure.

Referring now to FIG. 8, a second method 400 for detecting when the rotor is restricted from rotating starts in step 401. In step 402, the power control module 206 positions the rotor 116 at the first position. In step 404, the power control module 206 applies the testing voltage to the stator coils 114 of the first pole pair. In step 406, the power control module 206 measures the transient current through the stator coils 114 of the first pole pair. In step 408, the power control module 206 determines whether the transient current is greater than or equal to the threshold current. If the result of step 408 is false, the method 400 repeats step 408. If the result of step 408 is true, the method 400 continues with step 410. In step 410, the inductive sensing module 210 determines the first sensing period.

In step 412, the power control module 206 positions the rotor 116 at the second position. In step 414, the power control module 206 applies the testing voltage to the stator coils 114 of the first pole pair. In step 416, the power control module 206 measures transient current through the stator coils 114 of the first pole pair. In step 418, the power control module 206 determines whether the transient current is greater than or equal to the threshold current. If the result of step 418 is false, the method 400 repeats step 418. If the result of step 418 is true, the method 400 continues with step 420. In step 420, the inductive sensing module 210 determines the second sensing period.

In step 422, the threshold determination module 212 determines the difference between the first sensing period and the second sensing period. In step 424, the threshold determination module 212 determines whether the difference is less than or equal to a second threshold period. If the result of step 424 is false, the method 400 continues with step 426. If the result of step 424 is true, the method 400 continues with step 428. In step 426, the threshold determination module 212 determines that the rotor 116 is not restricted. In step 428, the threshold determination module 212 determines that the rotor 116 is restricted. The method 400 ends in step 430.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A control system, comprising:
   a position control module configured to apply a driving current for positioning a rotor of a motor at a first position or a second position;
   a power control module configured to apply
      a first voltage to one of a first phase and a second phase of the motor to generate a first current after the position control module applies the driving current for positioning the rotor at the first position, and
      a second voltage to one of the first phase and the second phase to generate a second current after the position control module applies the driving current for positioning the rotor at the second position; and
   a diagnostic module configured to i) determine a first period that begins when the first voltage is applied and that ends when the first current is greater than or equal to a threshold current, ii) determine a second period that begins when the second voltage is applied and that ends when the second current is greater than or equal to the threshold current, and iii) determine whether the rotor is restricted from rotating based on a difference between the first period and the second period.

2. The control system of claim 1, wherein the position control module is configured to:
   apply the driving current to at least one of the first phase and the second phase for positioning the rotor at the first position; and
   apply the driving current to at least one of the first phase and the second phase for positioning the rotor at the second position.

3. The control system of claim 1, wherein the power control module is configured to:
   apply the first voltage to the first phase to generate the first current; and
   apply the second voltage to the first phase to generate the second current.

4. The control system of claim 1, wherein the power control module is configured to:
   apply the first voltage to the first phase to generate the first current; and
   apply the second voltage to the second phase to generate the second current.

5. The control system of claim 1, wherein the diagnostic module is configured to determine that the rotor is restricted from rotating when a difference between the first period and the second period is greater than or equal to a predetermined threshold.

6. The control system of claim 1, wherein the diagnostic module is configured to determine that the rotor is restricted from rotating when a difference between the first period and the second period is less than or equal to a predetermined threshold.

7. The control system of claim 1, wherein the motor is comprises a two-phase brushless direct current motor.

8. The control system of claim 1, wherein each of the first current and the second current is less than an amount of current that is sufficient to cause the rotor to rotate.

9. A method, comprising:
   applying a driving current for positioning a rotor of a motor at a first position or a second position;
   applying a first voltage to one of a first phase and a second phase of the motor to generate a first current after applying the driving current for positioning the rotor at the first position;
   applying a second voltage to one of the first phase and the second phase to generate a second current after applying the driving current for positioning the rotor at the second position;
   determining a first period that begins when the first voltage is applied and that ends when the first current is greater than or equal to a threshold current;
   determining a second period that begins when the second voltage is applied and that ends when the second current is greater than or equal to the threshold current;
   determining that the rotor is restricted from rotating based on the first period and the second period; and
   determining whether the rotor is restricted from rotating based on a difference between the first period and the second period.

10. The method of claim 9, further comprising:
    applying the driving current to at least one of the first phase and the second phase for positioning the rotor at the first position; and
    applying the driving current to at least one of the first phase and the second phase for positioning the rotor at the second position.

11. The method of claim 9, further comprising:
    applying the first voltage to the first phase to generate the first current; and
    applying the second voltage to the first phase to generate the second current.

12. The method of claim 9, further comprising:
    applying the first voltage to the first phase to generate the first current; and
    applying the second voltage to the second phase to generate the second current.

13. The method of claim 9, further comprising determining that the rotor is restricted from rotating when a difference between the first period and the second period is greater than or equal to a predetermined threshold.

14. The method of claim 9, further comprising determining that the rotor is restricted from rotating when a difference between the first period and the second period is less than or equal to a predetermined threshold.

15. The method of claim 9, wherein the motor comprises a two-phase brushless direct current motor.

16. The method of claim 9, further comprising:
    applying the first voltage to one of the first phase and the second phase of the motor to generate a first current that is less than an mount of current that is sufficient to cause the rotor to rotate; and
    applying the second voltage to one of the first phase and the second phase to generate a second current that is less than an amount of current that is sufficient to cause the rotor to rotate.

* * * * *